United States Patent [19]

Flatley

[11] 4,174,217

[45] Nov. 13, 1979

[54] METHOD FOR MAKING SEMICONDUCTOR STRUCTURE

[75] Inventor: Doris W. Flatley, North Brunswick, N.J.

[73] Assignee: RCA Corporation, New York, N.Y.

[21] Appl. No.: 494,179

[22] Filed: Aug. 2, 1974

[51] Int. Cl.² .................. H01L 21/84; H01L 21/86
[52] U.S. Cl. .................. 96/36.2; 96/27 R; 96/35; 148/187; 156/662; 156/659.1; 427/82; 427/93; 427/94; 427/108; 427/259
[58] Field of Search ................ 117/212, 215; 96/36.2, 96/27 R, 35; 427/82, 108, 93, 94, 259; 156/3, 11, 17, 659, 662

[56] References Cited

U.S. PATENT DOCUMENTS

| | | | |
|---|---|---|---|
| 3,508,982 | 4/1970 | Shearin, Jr. | 96/36.2 |
| 3,649,268 | 3/1972 | Chu et al. | 96/36.2 |
| 3,740,280 | 6/1973 | Ronen | 96/36.2 |
| 3,743,847 | 7/1973 | Boland | 96/36.2 |

OTHER PUBLICATIONS

Kühl et al., *Optical Investigation of Different Silicon Films*, in J. Electrochem. Soc.:Solid–State Science and Technology, 121(11):pp. 1496–1500, Nov. 1974.

Sze, S. M., *Physics of Semiconductor Devices*, 1969, John Wiley & Sons, New York, p. 661.

*Primary Examiner*—John D. Smith
*Attorney, Agent, or Firm*—H. Christoffersen; R. P. Williams; D. S. Cohen

[57] ABSTRACT

A semiconductor structure from which various types of active semiconductor devices can be formed is made of a semiconductor island on a transparent substrate, having thereon an electrically insulating layer of a protective material, such as silicon dioxide, which extends onto and covers the sides of the semiconductor island. The protective layer can either cover only the sides of the semiconductor island or extend over the top edge of the island. The protective layer is made by etching through a photoresist mask made of a negatively reacting photoresist which is formed by exposure to irradiation from beneath the uncovered surface of the substrate, whereby the thickness of the silicon island and the flux density of the irradiation are selected so that for a particular duration, the irradiation is completely attenuated by the semiconductor island.

14 Claims, 17 Drawing Figures

METHOD FOR MAKING SEMICONDUCTOR STRUCTURE

The present invention relates generally to semiconductor devices and methods of making the same. It relates specifically to a method of providing a protective barrier for the sides and top edge of a semiconductor island on a substrate.

When N-MOS, P-MOS, and C-MOS devices are fashioned in silicon-on-sapphire, spinel, or other insulating substrate material, the semiconductor islands of silicon are defined before the diffusion of impurities into the silicon. Various types of active semiconductor devices, such as these, are usually formed with a plurality of electrically isolated semiconductor islands on a single substrate. The entire top surface of the substrate with the semiconductor islands thereon is coated with a masking oxide, such as silicon dioxide, and windows for diffusion of the impurities into the semiconductor are formed by etching. These windows usually, in most processes, extend over and below the edge and sides of the semiconductor islands. This is done in order that the area of diffusion is increased. Increasing the area of diffusion by increasing the opening of a window increases the junction area and thereby reduces the junction capacitance. The disadvantage of this is that these large windows leave the edges and a portion of the sides of the semiconductor island and the adjacent substrate unprotected during a diffusion of an impurity into the semiconductor island. Several failure modes are manifested in the production of devices when the interface between the semiconductor island and the substrate and the top edge of the semiconductor island are permitted to be exposed to diffusion.

One problem that can occur during diffusion is erosion of the unprotected interface between the edge of the semiconductor island and the substrate. The result is the creation of discontinuities in conductive films later deposited in crossing relation to the island edge. On occasion, these discontinuities cause a type of failure whereby the discontinuities result in openings in the circuit paths incorporating the particular film.

These discontinuities are also caused by the growth of the gate oxide for a device at temperatures below 1000° C. on a semiconductor island of silicon heavily doped with phosphorus. Under these conditions, oxide growth occurs at an accelerated rate. The accelerated growth in the oxide thickness, coupled with the erosion of the sapphire substrate, causes undercutting of the edge of the silicon island. When the oxide at the interface between the edge of the silicon and the sapphire substrate is removed, a discontinuity or gap is produced.

In order to have a proper deposition of the film onto a semiconductor island on a substrate, it is necessary that the slope of the island edge merge evenly with the substrate. No abrupt changes in slope are permissible.

In particular, for silicon-on-sapphire devices, a phosphorus dopant can react with the sapphire substrate. This reaction has the result of eroding the sapphire at the abutting edge of the silicon island. For silicon-on-spinel devices, boron can react with spinel to erode the spinel at the edge of the silicon island. One method of preventing this kind of erosion and deformation of the interface between the edge of a semiconductor island and the substrate is to provide a protective barrier on top of the substrate and at the interface. This protective barrier is usually a layer of silicon dioxide which extends from the substrate onto the sides of the semiconductor island. A method of forming such a silicon dioxide protective layer is amply disclosed in the U.S. Pat. No. 3,740,280, entitled "Method of Making semiconductor Device," issued to Ram Shaul Ronen on June 19, 1973. The Ronen patent discloses a method by which a protective layer of silicon dioxide is formed only on the surface of the substrate and the sides of the semiconductor island. The Ronen patent differs in method from the present invention, because it uses a removable metal layer formed on the top surface of the semiconductor island to block irradiation from beneath the substrate instead of a selection of the thickness of the semiconductor island and the duration of the flux density of the irradiation, to form the photoresist mask.

Another problem that can occur when diffusion is permitted through a window which encompasses a side of the semiconductor island is the creation of an additional transistor device on that side of the semiconductor island. This additional device is electrically connected to the device formed on the top surface of the island and is separated from the top surface by the top edge of the island. By removing each side and each associated top edge of an island from exposure to dopants during source and drain diffusion, this problem may be resolved and the electrical operating characteristics of a device formed from the structure significantly improved. One way of removing each aforementioned side and top edge is to apposition a layer of a protective material, such as silicon dioxide, on each side and extend it beyond the associated top edge of the island. It is important that the silicon dioxide merely extend only slightly over the edge in order that junction capacitance may be minimized.

Figure 1:
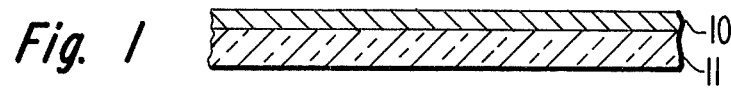
FIGS. 1 through 4 are sectional views showing steps of making semiconductor islands on a substrate.

The basic starting structure for making a plurality of MOS transistors on a singular substrate is shown in FIG. 1. There is a layer 10 of a semiconductor appositioned to a substrate 11. The layer 10 is a starting material from which semiconductor islands may be formed, using a standard KOH etchant or similar etchant solution. The layer 10 may be of any known semiconductor material, such a silicon, germanium, or a group III–V compound semiconductor, which contains suitable conductivity modifiers or dopants. The substrate 11 may be of any insulating material on which the particular semiconductor of layer 10 can be epitaxially grown. Among the materials suitable for the substrate 11 are sapphire, spinel, or the same semiconductor material as the layer 0. Use of the same semiconductor material as the layer 10 for the substrate 11 is permissible only if the semiconductor substrate 11 is doped so that it has a very high resistance. Essential to the invention is the additional requirement that the substrate 11 be transmissive to irradiation for which the semiconductor layer 10 is highly absorptive.

Figure 2:
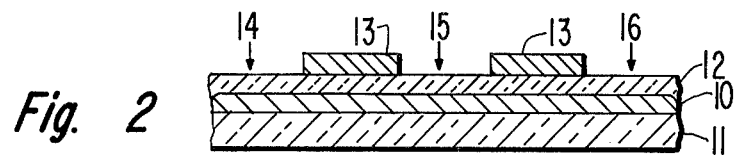
Figure 3:
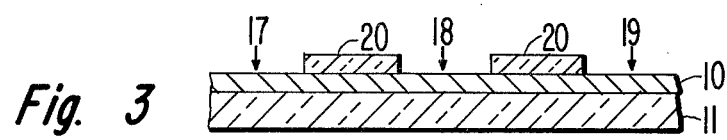

In one example of the present device, the layer 10 is of silicon epitaxially grown on a substrate 11 of sapphire. The layer 10 is next coated with another layer 12 of silicon dioxide (FIG. 2), which is masked with a pattern 13 of a standard photoresist having apertures 14, 15, and 16 therein for selectively etching the layer 12. The layer 12 is then etched with any one of the etching solutions commonly used in this art, such as the hydrofluoric acid solutions. The structure formed from the etching is shown in FIG. 3. As shown therein, the photoresist mask 13 of FIG. 2 has been removed. Apertures 17, 18, and 19 are thus formed in the layer 12 (see FIG. 2), and these apertures permit a silicon etchant, such as potassium hydroxide or an equivalent commonly known in the art, to remove the silicon at the bottom thereof, while the remaining portions 20 of silicon dioxide protect selected portions of the top of the layer 10 of silicon.

Figure 4:
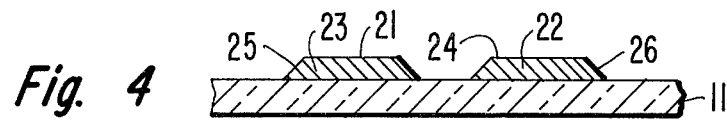

FIG. 4 shows the resultant structure from the above-described etching steps and maskings. Shown therein are silicon islands 21 and 22, with the portions 20 (see FIG. 3) removed.

Each of the islands 21 and 22 shown in FIG. 4 can be used to manufacture an MOS transistor device, or both may be used to manufacture a complementary set. Islands 21 and 22 have, respectively, horizontal top surfaces 23 and 24, side surfaces 25 and 26 juxtaposed to the substrate 11. The islands 12 and 22 on the substrate 11 comprises the basic structure necessary for the practice of the art and method encompassed by this invention.

Figure 5:
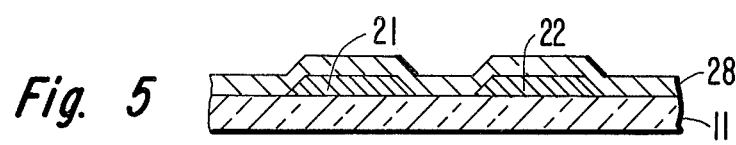
FIGS. 5 through 9 are sectional views showing steps of forming one form of the semiconductor structure of the invention.

As shown in FIG. 5, the first step using the method of the invention is to form a coating 28 of silicon dioxide, for example, on the entire top surface of the basic structure. The coating 28 may be applied by any well known technique for coating silicon dioxide on the substrate 11. For example, silicon dioxide, silicon nitride, or aluminum oxide can be applied by pyrolytically reacting a gaseous mixture containing the elements of either of these protective materials to form the coating 28 which is deposited on the substrate 11. Silicon dioxide can be deposited from a mixture of silane and either oxygen or water vapor; silicon nitride from silane in a gaseous ammonia; and aluminum oxide from aluminum chloride, carbon dioxide, and hydrogen.

Figure 6:
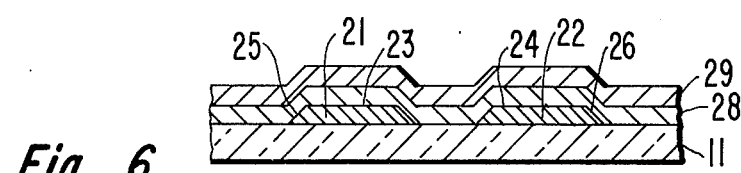

As shown in FIG. 6, a coating 28 of a radiation responsive substance, such as a polymerizing photoresist, is formed on the surface of the coating 28. The coating 28 is made sufficiently thin to allow the transmittance of irradiation to which the coating 29 of photoresist can react. In addition, the absorption coefficients of the substrate and semiconductor islands 21 and 22 are selected so as to allow the selected irradiation to be transmitted through the substrate 11 but be blocked or sufficiently attenuated by the islands 21 and 22. This is accomplished by adjusting the flux density of the irradiation from the source 30, so that for the thickest portion of the semiconductor islands 21 and 22, no irradiation passs through. However, since the sides 25 and 26 of the semiconductor islands are not perpendicular to the surfaces 23 and 24, but slanted at either a 45° angle or a 55° angle toward a normal extending from the surface of the substrate 11 through either semiconductor island, irradiation encountering the underside of the semiconductor islands beneath the slanted sides 25 and 26 of the islands passes through a lesser thickness of semiconductor material than irradiation passing through portions of the semiconductor islands beneath the top surfaces 23 and 24. Accordingly, a greater attenuation of irradiation occurs for the thicker portion of the semiconductor island and a lesser attenuation occurs for radiation passing through the thinner portions of the semiconductor island. The effect of this selection is that the coating 29 of negatively reacting photoresist on the surfaces 23 and 24 are not exposed, while photoresist in the layer 29 on other portions of the layer 28 are exposed. Thus, portions of the layer 29 will remain after development of the photoresist to serve as an etch mask, as shown in FIGS. 7a and 7b.

An irradiation source 30, shown in FIG. 6, usually an ultraviolet lamp, is used to irradiate the layer 29 of negatively reacting photoresist. The relative thickness of the substrate 11 and the islands 21 and 22 of silicon are not important as long as the absorption coefficient of the islands is at least 1000 times greater than that of the substrate for a preselected frequency of irradiation.

Figure 7A:
Figure 7A:
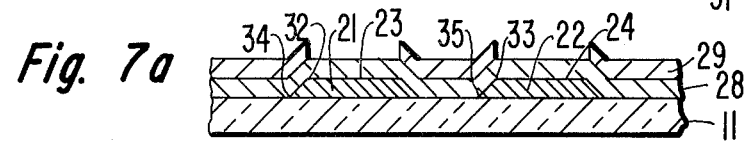
Figure 7B:
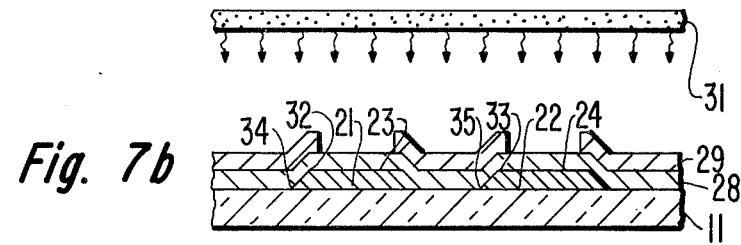
Figure 8A:
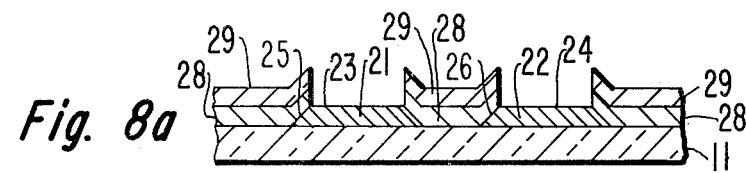
Figure 8B:
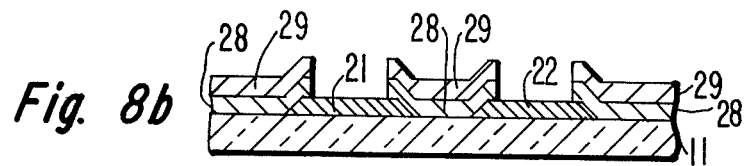

As illustrated in FIG. 7a, once the photoresist pattern is developed from the layer 29, the exposed portions of the layer 28 of silicon dioxide are etched away with an etchant source 31. The resultant structures formed by etching according to the pattern in the layer 29 are illustrated in FIGS. 8a and 8b.

Figure 9A:
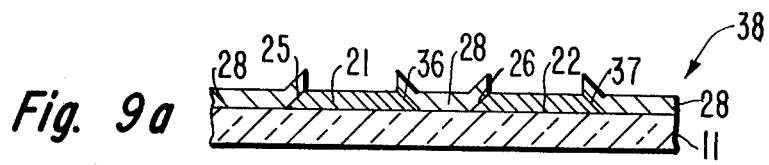

FIG. 7a shows a structure produced by the method of the invention wherein the mask formed by the layer 29 of photoresist is produced by an exposure of irradiation sufficient only to polymerize the photoresist up to the top edges 32 and 33 of the semiconductor islands 21 and 22, respectively. When the exposed portion of the protective layer 28 is etched away, only the lower bottom edges 34 and 35 will be protected by the layer 28. In FIG. 7b, the mask formed by the layer 29 of photoresist is shown extending over the top edges 32 and 33 as well as the bottom edges 34 and 35 of the semiconductor islands 21 and 22, respectively. That portion of the photoresist which polymerizes may be made to extend over the top edges of the semiconductor islands, as shown in FIG. 7b, by extending the duration of the exposure by 50 percent beyond that necessary to produce the photoresist pattern shown in FIG. 7a. The increase in the exposure duration causes diffusion of the irradiation in the portions of the photoresist and protective layer 28 above the top surfaces 23 and 24, respectively, of the semiconductor islands 21 and 22. This phenomenon causes a slight extension of the photoresist pattern of layer 29 beyond the top edges 32 and 33 of the semiconductor islands. The extension ranges from 1.0 to 2.0 micrometers. Accordingly, FIG. 8a shows the resultant structure of the method of the invention wherein the protective layer 28 extends only over the sides 25 and 26 of the semiconductor islands 21 and 22, respectively. The photoresist mask formed from layer 29 is shown atop the protective layer 28 in both FIGS. 8a and 8b. In the structure of FIG. 8b, both the photoresist mask and the mask formed from the etching of the exposed portion of the protective layer 28 extend over the top edges of the semiconductor islands. The photoresist pattern in the layer 29 is removed by a solution known in the art for this purpose, and the remaining semiconductor structures for FIGS. 8a and 8b are shown, respectively, in FIGS. 9a and 9b, as structure 38 and structure 39. Structure 38 shows the protective layer 28 of silicon dioxide covering only the sides 25 and 26 of the semiconductor islands 21 and 22 of silicon, respectively. Structure 39 is semiconductor islands 21 and 22 appositioned onto the substrate 11 and having the protective layer 28 of silicon dioxide extend over and beyond the top edges 32 and 33 of the semiconductor islands 21 and 22, respectively.

The following examples illustrate essential parameters and facts which shall enable a person of ordinary skill in this art to practice the invention as described herein:

EXAMPLE I: In making the semiconductor structure 38 illustrated in FIG. 9a, a sapphire substrate having a thickness of 10 micrometers was used. For a silicon island thickness of 0.6 micrometers epitaxially grown on the sapphire substrate, with 6000Å of silicon dioxide as a protective layer, a 5000Å layer of negatively reacting photoresist was properly exposed with a 2.0 second back irradiation of ultraviolet light. The photoresist used was a commercially available WAYCOAT photoresist, the viscosity of which was 28 centipoise. Irradiation was performed in a Casper 1700A wafer aligner utilizing a 200-watt mercury vapor lamp. The absorption coefficient for the silicon islands was in the range of $10^4$ to $10^6$ cm$^{-1}$. The absorption coefficient for the sapphire substrate was approximately zero. The WAYCOAT photoresist is sensitive to irradiation in the range of 3000Å to 4000Å.

EXAMPLE II: Using the equipment and materials described above, a plurality of silicon islands 1.0 micrometers thick were used to produce the structure 38 illustrated in FIG. 9a, with an irradiation duration of 2.5 seconds.

EXAMPLE III: Again using the equipment and parameters expressd in Example I above, the structure 39 of FIG. 9b was produced for a silicon island 1.0 micrometers thick, with an irradiation duration of 3.75 seconds.

Either semiconductor structure 38 of semiconductor structure 39 can be used effectively with gaseous oxide diffusion sources, doped oxide diffusion sources, or with combinations of doped oxide and gaseous diffusion sources in the manufacture of P-MOS, N-MOS, and C-MOS transistor devices.

Figure 9B:
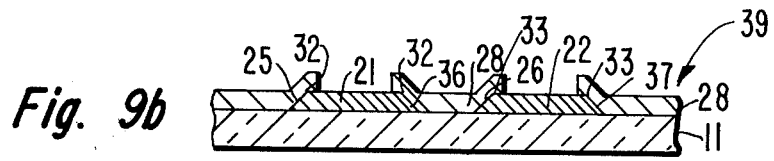
Figure 10:
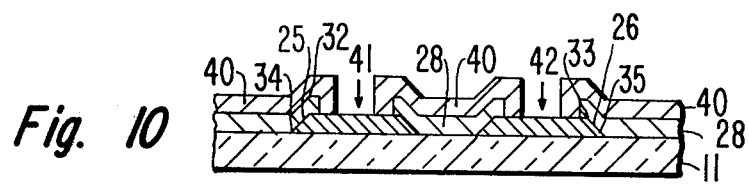
FIG. 10 is a sectional view showing a method of forming the source and drain in the semiconductive structure of the invention by solid-to-solid diffusion.

FIG. 10 shows the semiconductor structure 39, intially shown in FIG. 9b, with a patterned layer 40 of silicon dioxide doped with either phosphorus or boron, from which sources and drains can be produced. Apertures 41 and 42 provide neutral regions for the gate and for the formation of the gate contacts. Each of the islands 21 and 22 is then further processed by steps well known in this art, including diffusion of conductivity modifiers into the islands 21 and 22 from the doped silicon dioxide layer 40. The top edges 32 and 33 and the edges 34 and 35 interfacing with the substrate 11 are protected from the adverse effects of the diffusion by the layer 28 of silicon dioxide, which forms a protective barrier for these edges as well as the portions of the substrate surface not covered by the islands and the sides 25 and 26 of the islands.

Figure 11:
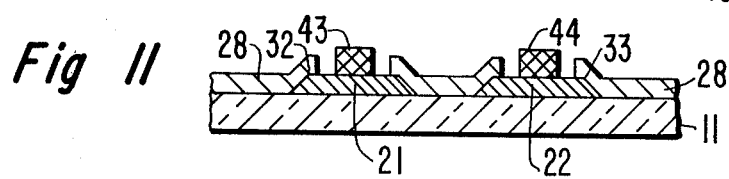
FIG. 11 is a sectional view showing a method of forming the source and drain in a semiconductor structure of the invention by gaseous diffusion.

FIG. 11 illustrates the use of the semiconductor structure 39 with an undoped silicon dioxide diffusion mask constituted by oxide blocks 43 and 44 above the channel. The sources and drains (not shown) are formed in this method by gaseous diffusion from a source 45. After formation of the sources and drains, the oxide blocks 43 and 44 are removed, and the structure 39 is further processed according to techniques well known to persons of ordinary skill in this art. Again, the substrate 11 and top edges 32 and 33 of the semiconductor islands are protected from adverse effects from diffusion processing.

Figure 12:
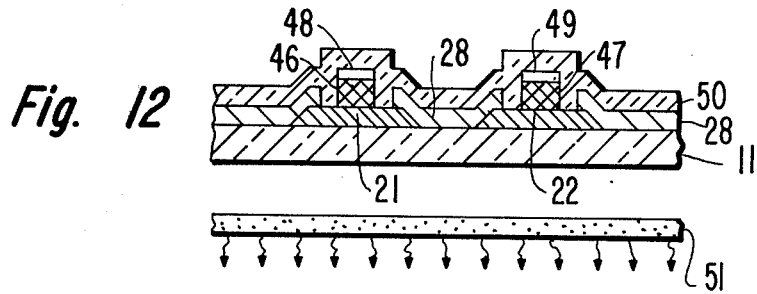
FIG. 12 is a sectional view showing a doped, solid silicon dioxide method of forming the source and drain in a semiconductor structure of the invention having a polycrystalline silicon gate.

FIG. 12 is provided to illustrate the use of the structure 39 of FIG. 9b in the manufacture of devices having a polycrystalline silicon gate electrode. First, undoped silicon dioxide gate insulators 46 and 47 are formed on the islands 21 and 22 of silicon, and the top surfaces of the insulators 46 and 47 are covered with polycrystalline silicon bodies 48 and 49 by methods well known in this art. Source and drain regions (not shown) are then formed by means of a layer 50 of silicon dioxide, doped with either phosphorus or boron, depending whether N channel or P channel devices, respectively, are to be formed.

Figure 13:
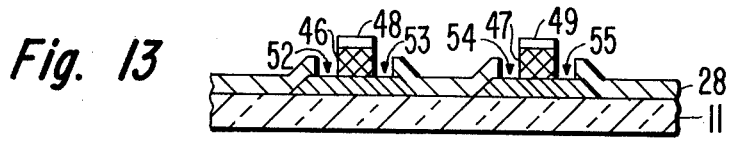
FIG. 13 is a sectional view showing a method of forming the source and drain by gaseous diffusion in a semiconductor structure of the invention having a polycrystalline silicon gate.

The structure of FIG. 12, with only the polycrystalline silicon gate bodies 48 and 49 formed on the islands, may be used with a gaseous diffusion source 51, as illustrated in FIG. 13. The polycrystalline silicon bodies 48 and 49 and the silicon oxide insulators 46 and 47 provide apertures 52, 53, 54, and 55 for the diffusion of conductivity modifiers into the islands 21 and 22, respectively.

Figure 14:
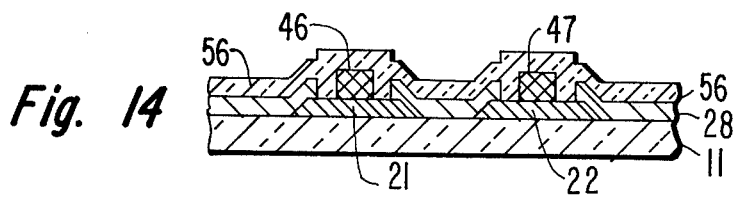
FIG. 14 is a sectional view showing a doped oxide method of forming the source and drain in a semiconductor structure of the invention having an undoped silicon dioxide mask for the channel.

FIG. 14 is provided to illustrate that undoped formations 46 and 47 of silicon dioxide may be used to mask the channel region and provide apertures for the formation of sources and drains in the islands 21 and 22 by solid-to-solid diffusion from a doped silicon dioxide coating 56.

What is claimed is:

1. A method for making a protective barrier for selected exposed portions of P-N epitaxial semiconductor island consisting of semiconductive material and conductivity modifiers appositioned to a substrate, said island having a top extending along the thickest portion of the island and an edge extending from the top along thinner portions of the island, said method comprising the steps of:

preselecting the thickest portion of the semiconductor island such that said portion absorbs a preselected intensity of ultraviolet radiation of a particular wavelength, coating surfaces of the semiconductor island with a protective material which material is transmissive to said ultraviolet radiation, coating the protective material with a material which is responsive to said radiation for providing a masking layer on said semiconductor island which masking layer is selected by exposure to the radiation, irradiating the radiation responsive material with said radiation of a preselected intensity through the substrate from the side opposite the substrate surface hving a semiconductor island thereon, the thickest portion of the semiconductor island substantially absorbing the radiation of the preselected intensity, all of the thinner portions of the semiconductor island transmitting the radiation of the preselected intensity, thereby exposing all of said radiation responsive material above the thinner portions to the radiation, and further irradiating said radiation responsive material for an additional preselected time thereby exposing a predetermined area of the masking layer which area extends above the thickest portion of the island from the edge.

2. A method according to claim 1 further comprising the step of removing exposed portions of the protective material whereby only the top surface of the island is exposed and whereby edge surfaces of the island have appositioned thereto a protective barrier.

3. A method according to claim 2 wherein the absorption coefficient of the semiconductor island is at least 1000 times greater than the absorption coefficient of the substrate.

4. A method according to claim 3 wherein the protective material is silicon dioxide, and the substrate is transmissive to ultraviolet radiation.

5. A method according to claim 4 wherein the substrate is sapphire.

6. A method according to claim 5 wherein the semiconductor is silicon.

7. A method according to claim 6 wherein the radiation responsive material is a photoresist which polymerizes in response to said ultraviolet radiation.

8. A method for making a protective barrier for selected exposed portions of surfaces of an epitaxial semiconductor island consisting of semiconductive material and conductivity modifiers, the island being appositioned to a substrate, said island having a top extending along a thickest portion of the island and an edge extending from the top along thinner portions of the island, said method comprising the steps of:

selecting the thickest portion of the semiconductor island, coating surfaces of the semiconductor island with a protective material, transmissive to ultraviolet radiation of a particular wavelength, coating the protective material with a material which is responsive to said radiation for providing a masking layer on said semiconductor island which is selected by exposure to said radiation, irradiating the radiation responsive material with the radiation of an intensity through the substrate from the side opposite the substrate surface having the semiconductor thereof, and adjusting the intensity of the radiation so that the thickest portion of the semiconductor island substantially absorbs the radiation of the adjusted intensity and all of the thinner portions of the semiconductor island transmit the radiation of the adjusted intensity thereby exposing all of said radiation responsive material above the thinner portions to the radiation, and further irradiating said radiation responsive material for an additional preselected time thereby exposing a predetermined area of the masking layer which area extends above the thickest portion of the island from the edge.

9. A method according to claim 8, further comprising the step of removing exposed portions of the protective material whereby only the top surface of the island is exposed and whereby edge surfaces of the island have appositioned thereto a protective barrier.

10. A method according to claim 9 wherein the absorption coefficient of the semiconductor island is at least 1000 times greater than the absorption coefficient of the substrate.

11. A method according to claim 10, wherein the protective material is silicon dioxide, and the substrate is transmissive to ultraviolet radiation.

12. A method according to claim 11 wherein the substrate is sapphire.

13. A method according to claim 12 wherein the semiconductor is silicon.

14. A method according to claim 13 wherein the radiation responsive material is a photoresist which polymerizes in response to said ultraviolet radiation.

* * * * *